United States Patent
Sarwary

(10) Patent No.: US 9,208,272 B2
(45) Date of Patent: *Dec. 8, 2015

(54) APPARATUS AND METHOD THEREOF FOR HYBRID TIMING EXCEPTION VERIFICATION OF AN INTEGRATED CIRCUIT DESIGN

(71) Applicant: Synopsys, Inc., Mountain View, CA (US)

(72) Inventor: Mohamed Shaker Sarwary, San Diego, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/047,396

(22) Filed: Oct. 7, 2013

(65) Prior Publication Data

US 2014/0040841 A1 Feb. 6, 2014

Related U.S. Application Data

(63) Continuation of application No. 13/209,702, filed on Aug. 15, 2011, now Pat. No. 8,560,988.

(60) Provisional application No. 61/373,511, filed on Aug. 13, 2010.

(51) Int. Cl.
G06F 9/455 (2006.01)
G06F 17/50 (2006.01)

(52) U.S. Cl.
CPC .......... *G06F 17/5045* (2013.01); *G06F 17/504* (2013.01); *G06F 17/5031* (2013.01)

(58) Field of Classification Search
CPC  G06F 17/5045; G06F 17/504; G06F 17/5031
USPC ................ 716/106, 108, 111, 112, 113, 134; 703/19

See application file for complete search history.

(56) References Cited

U.S. PATENT DOCUMENTS

| | | |
|---|---|---|
| 6,438,731 B1 | 8/2002 | Segal |
| 6,496,972 B1 | 12/2002 | Segal |
| 6,678,644 B1 | 1/2004 | Segal |

(Continued)

OTHER PUBLICATIONS

"An Efficient Algorithm to Verify Generalized False Paths", by Oliver Coudert, Jun. 13-18, 2010 ACM.*

(Continued)

*Primary Examiner* — Nha Nguyen
(74) *Attorney, Agent, or Firm* — Fenwick & West LLP

(57) ABSTRACT

Timing Constraints are crucial to meet timing requirements of an Integrated Circuit (IC). Timing exceptions are specified so that certain paths of the design of the IC are not timed as they are not relevant for the speed of the IC. If a path is specified as an exception but it is indeed a timing-relevant path then the design may functionally fail due to timing violations ignored by the timing analysis tools. It is therefore extremely important to ensure that all timing exceptions are correctly specified. The Hybrid Timing Exceptions Verification uses static verification as well as dynamic verification to effectively verify correctness of such timing exceptions. The solution pin-points the errors in the exceptions specification with very low number of false errors that would require significant designer inputs and time to manually waive them.

12 Claims, 3 Drawing Sheets

(56) References Cited

U.S. PATENT DOCUMENTS

| | | | |
|---|---|---|---|
| 6,964,027 B2 | 11/2005 | Kucukcakar et al. | |
| 7,127,693 B2 | 10/2006 | Tanaka | |
| 7,249,334 B2 | 7/2007 | Nakashiba | |
| 7,299,437 B2 | 11/2007 | Higuchi | |
| 7,526,745 B2 | 4/2009 | Vergara-Escobar | |
| 7,555,689 B2 | 6/2009 | Goswami et al. | |
| 7,584,443 B1 | 9/2009 | Govig et al. | |
| 7,650,581 B2 | 1/2010 | Rahim et al. | |
| 7,774,730 B2 | 8/2010 | Kanamaru | |
| 7,778,790 B2 | 8/2010 | Furuya | |
| 7,818,700 B2 | 10/2010 | Muller-Brahms | |
| 7,926,011 B1 | 4/2011 | Levitsky et al. | |
| 7,984,354 B2 | 7/2011 | Goswami et al. | |
| 8,141,015 B1 | 3/2012 | Govig et al. | |
| 2005/0125468 A1 | 6/2005 | Enenkel | |
| 2008/0098271 A1* | 4/2008 | Muller-Brahms | 714/738 |
| 2008/0288904 A1* | 11/2008 | Rahim et al. | 716/6 |
| 2010/0064263 A1 | 3/2010 | Rahim et al. | |

OTHER PUBLICATIONS

"FishTail: The Formal Generation, Verfiication, and Management of Golden Timing Constraints", by FishTail, Date base on use of (http://fishtail-da.com/whitepaper.htm) WayBack machine , Jun. 15, 2008.*

* cited by examiner

APPARATUS AND METHOD THEREOF FOR HYBRID TIMING EXCEPTION VERIFICATION OF AN INTEGRATED CIRCUIT DESIGN

CROSS-REFERENCE TO RELATED PATENT APPLICATION

This application is a continuation of U.S. patent application Ser. No. 13/209,702, filed on Aug. 15, 2011, which further claims priority from U.S. Provisional Patent Application No. 61/373,511 filed Aug. 13, 2010, the entire disclosures of which applications are incorporated by reference.

TECHNICAL FIELD

Apparatuses and methods consistent with the present invention relate to the field of integrated circuits design timing verification and in particular verification of timing exceptions specified by a designer as part of design constraints of an integrated circuit design. More particularly, they relate to a hybrid timing exception verification approach that involves static and dynamic verification.

BACKGROUND OF THE INVENTION

The design of integrated circuits (ICs) is increasing in complexity on a regular basis. Timing and power requirements in the final implementation are very critical and require adherence to complex timing constraints to ensure proper implementation and realistic timing analysis. More and more transistors are integrated on a single semiconductor device in ever increasing complexity of functions and modules. As design and manufacturing costs of such ICs have also become significant, it is essential to verify that the design and corresponding constraints have no flaws (also referred to as bugs) and may be at least substantially, if not completely, operative from the first manufacturing cycle. Typically, designers rely on manual review of design constraints including timing exceptions such as setting a path as a false-path or a multi-cycle path, typically done in the likes of Synopsis design constraint (SDC). This manual review is prone to human errors, especially as the design and corresponding constraints complexity increases in order to meet functionality, speed and power requirements of today's complex ICs.

An advance in the art over manual review of design constraints, known as static formal verification of timing exceptions, has been proposed in an attempt to automate the manual review process. This approach, purely functional, ignores the timing nature of exceptions leading to a very high number of false errors that take both time and effort to review and dispose of as false errors. For example, designers define timing exceptions on signals that are not expected to toggle during the functional execution of the design. This type of exceptions will be proved as false exceptions by a formal verification tool ignoring the static nature of the signal. Such false errors will require a manual review in order to dispose them of as false errors and keep the exceptions defined as correct exceptions. Due to close to 100% false-violations, an effect also known as 'tool noise', designers have not generally adopted this automated exception verification approach.

In view of the deficiencies of the prior art it would be advantageous to provide a solution for IC design constraints verification that is able to overcome the deficiencies of the prior art.

DETAILED DESCRIPTION OF THE INVENTION

Figure 1:
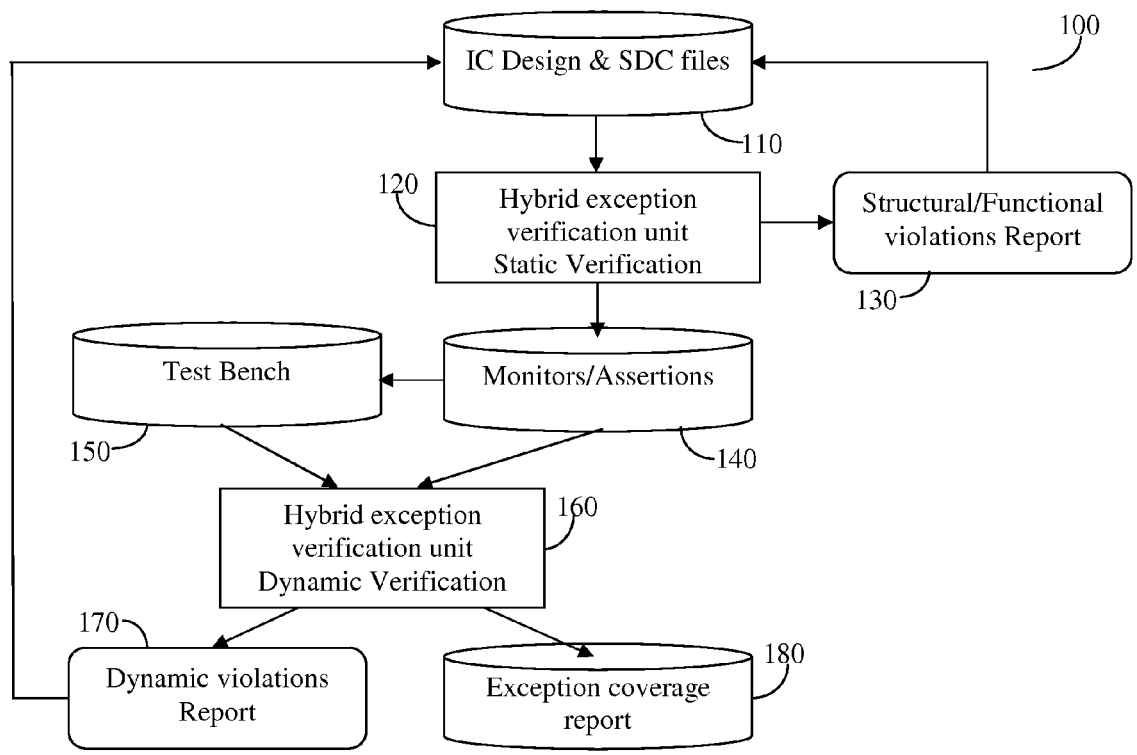
FIG. 1—is a schematic diagram of the principles of the operation of an exemplary hybrid exception verification system FIG. 2—is a diagram of an exemplary system for hybrid exception verification FIG. 3—is an exemplary flowchart of hybrid timing exception verification FIG. 4—is an exemplary circuit used to describe monitor for dynamic verification

Timing Constraints are crucial to meet timing requirements of an Integrated Circuit (IC). Timing exceptions are specified so that certain paths of the design of the IC are not timed as they are not relevant for the speed of the IC. If a path is specified as an exception but it is indeed a timing-relevant path then the design may functionally fail due to timing violations ignored by the timing analysis tools. It is therefore extremely important to ensure that all timing exceptions are correctly specified. The Hybrid Timing Exceptions Verification uses static verification as well as dynamic verification to effectively verify correctness of such timing exceptions. The solution pin-points the errors in the exceptions specification with very low number of false errors that would require significant designer inputs and time to manually waive them.

Depending on the nature of a timing exception, a different verification approach is needed in order to effectively verifying the exception to avoid false-errors. Timing exceptions are divided into two categories, false-path and multi-cycle path. While multi-cycle paths can generally be verified using static formal verification, most of false-path exceptions cannot be verified that way. False-path types handled ineffectively by static verification include asynchronous clock-to-clock (C2C) false-paths related to clock-domain-crossings (CDC), synchronous or asynchronous register-to-register (R2R) false-paths, non-topological false-paths, don't care related false-paths, paths related to design for testability (DFT) circuitry which are not active during the functional mode of an IC, environment assumptions, and various other types of timing false paths (FPs). Hence, using static formal verification on false-paths generates a significant amount of false violations and requires a designer to handle these errors manually. By contrast, dynamic verification can be effectively used to leverage designer's knowledge embedded in a test-bench to signoff exceptions verification without noise. The test-bench is typically already prepared by the designer for verification of the IC functionality. By combining static formal verification to verify multi-cycle paths as well as some false-path exceptions such as synchronous C2C false-paths, with static structural verification to verify false-paths such as timing don't cares and non-topological false-paths, and dynamic verification to verify false-paths stated above, a practically noiseless solution to timing exception verification, namely a hybrid exception verification system, is provided.

The apparatus and method disclosed herein suggest a hybrid verification mode where first the design and its corresponding timing exceptions are cleaned from errors that are detected by a static verification process. This static verification includes formal and structural verification of the timing exceptions in the design constraints file of an IC design. Second, timing exceptions, that are not verifiable by the static verification, are detected by generating assertions and/or monitors and using a dynamic verification process. This takes place by using a user supplied test-bench for the IC design, typically prepared by the designer routinely for other design verification purposes. The dynamic verification enables the detection of bugs for those dynamic timing exceptions using simulation.

FIG. 1 is an exemplary and non-limiting schematic diagram 100 of the principles of the operation of a hybrid exception verification system for an integrated circuit design. The IC design and the Synopsis design constraint (SDC) files (although other types of constraint files may be equally used), containing timing exceptions and other design constraints of the IC, are stored in a database 110. The hybrid verifier apparatus 120 reads these files and starts with categorizing the timing exceptions to be verified into the following categories: static structural timing exception, static formal timing exception, and dynamic timing exception. A static verification of this filtered list of exceptions is then performed. The static structural analysis explores the connectivity of the design in order to identify those exceptions that are set between signals which are actually not connected, or identify the exceptions which are set on signals that are not connected to any output of the design, therefore not influencing the functionality of the design, or any other connectivity reasons based on which a false path can be considered as false or proved not to be a correct false. The static formal analysis uses functional formal engines to explore design functionality to determine if synchronous C2C exceptions are correct or incorrect. Upon detection of any false timing exceptions identified by static structural and/or functional verification the apparatus reports errors back to the user who can now fix the bugs in the database 110, allowing for the correction of the design and/or SDC files as may be necessary. Exemplarily, a structural/functional violations report 130 may be generated. At this stage, an advantage of the above exemplary implementation is that the user, rather than being provided with a long list of false errors on his valid exceptions, is provided now only with a list of faulty timing exceptions which are very likely real design or exception problems, thereby significantly reducing the "tool noise" the designer of the IC has to face and handle. This may require several iterations which may be handled automatically, i.e., the correction may be performed by a computer aided design (CAD) system (not shown) semi-automatically, where the CAD system suggests one or more possible correction paths to the user to act upon, or manually, where the designer performs corrections to the design and SDC files and stores them for continued verification in the data storage 110.

Once the static verification has completed its cycles, i.e., no actual faulty exceptions are found, the dynamic verification can take place. For this purpose all the exceptions found that were filtered out from the static verification are now to be inspected dynamically. This involves the creations of monitors and/or assertions 140 in at least one file. The monitor generation is based on controllability analysis often used for DFT analysis (see FIG. 4 for an example), or any other modeling approach that can accurately model false-path and/or multi-cycle path exceptions, for example the one discussed in U.S. Pat. No. 7,650,581 by Rahim et al. assigned to common assignee and which is hereby incorporated by reference for all the useful information it may contain. The monitors and/or assertions are then combined with user test bench 150 that contains test vectors that can possibly uncover further faulty exceptions or corresponding design bugs. An example of the generation of a monitor is discussed with respect to FIG. 4 below. A simulation tool (such as NC-Sim by Cadence Design Systems or ModelSim by Mentor Graphics) 160 or a Hybrid exception verification unit 160 may now be used for the purpose of running verification tests exercising the IC design which can potentially identify new exception or design problems. The simulation tool 160 may be one of many commercially available simulation tools. The simulation tool 160, exercising the design and user test-bench instrumented by monitors and/or assertions generated by stage one of this apparatus, may then generate a violations report that includes all those exceptions that are now determined to have actual errors. This information is fed back to the designer so the IC design and/or SDC files in storage 110 are fixed and allowing for the repeat of the cycle once more, as may be necessary and/or desired. In accordance with another exemplary implementation, an exception coverage report 180 is generated that indicates, for example the quality of the user test-bench to uncover exception bugs in the design. This coverage report can be used by the user and/or an automatic test-bench creation tool to improve the quality of the test-bench for dynamic exception verification. A coverage report may be provided once the entire verification process takes place or once per simulation iteration as the case may be. A coverage report may further be generated for the static verification, either on a per iteration basis or otherwise as part of the final coverage report, or any combination thereof.

Figure 2:
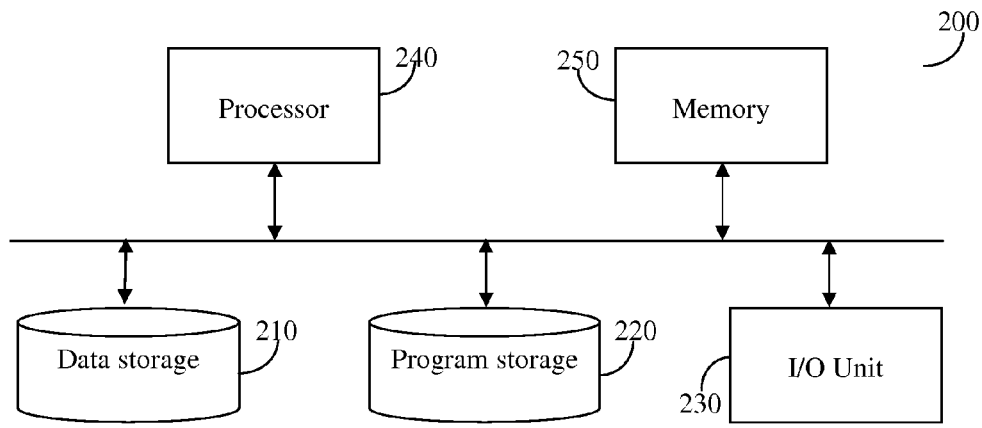

FIG. 2 depicts an exemplary and non-limiting diagram of a system 200 for hybrid exception verification in accordance with the invention. The system 200 may be a portion of the CAD system described hereinabove. A data storage unit 210 contains at least the IC design and its respective SDC files. A program storage 220 contains a plurality of programs and at least a static verification program and a dynamic verification program. The static verification program comprises at least one of a structural verification program and/or a functional verification program. According to an exemplary implementation, one or more of the storage units 210 and 220 may be remote to the system and accessed over a network of sorts (not shown). An input/output interface unit (I/O Unit) 230 enables the system 200 to communicate with other devices over an interface such as a network. Examples of the other devices include but are not limited to a user display (not shown), a keyboard (not shown) and other peripheral elements, as are commonly used by those of ordinary skill in the art. The I/O Unit 230 may be used by a designer to load programs into the program storage 220 or to load design and SDC files of an IC into data storage 210. It will be appreciated that in one exemplary implementation the storage units 210 and 220 are a single storage, while in other exemplary implementations a plurality of storage units may be used, each containing other portions needed for the proper operation of the system 200. A processor 240 and a memory 250 are further used to execute a management program stored in the program storage 220 and performing the functions discussed briefly with respect to FIG. 1 above and in more detail with respect of FIG. 3 below. The processor 240 executes instructions stored in program storage 220 using data of the IC design and SDC stored in data storage 210, and further using the memory 250 as at least a memory for holding temporary results as processing takes place.

Figure 3:
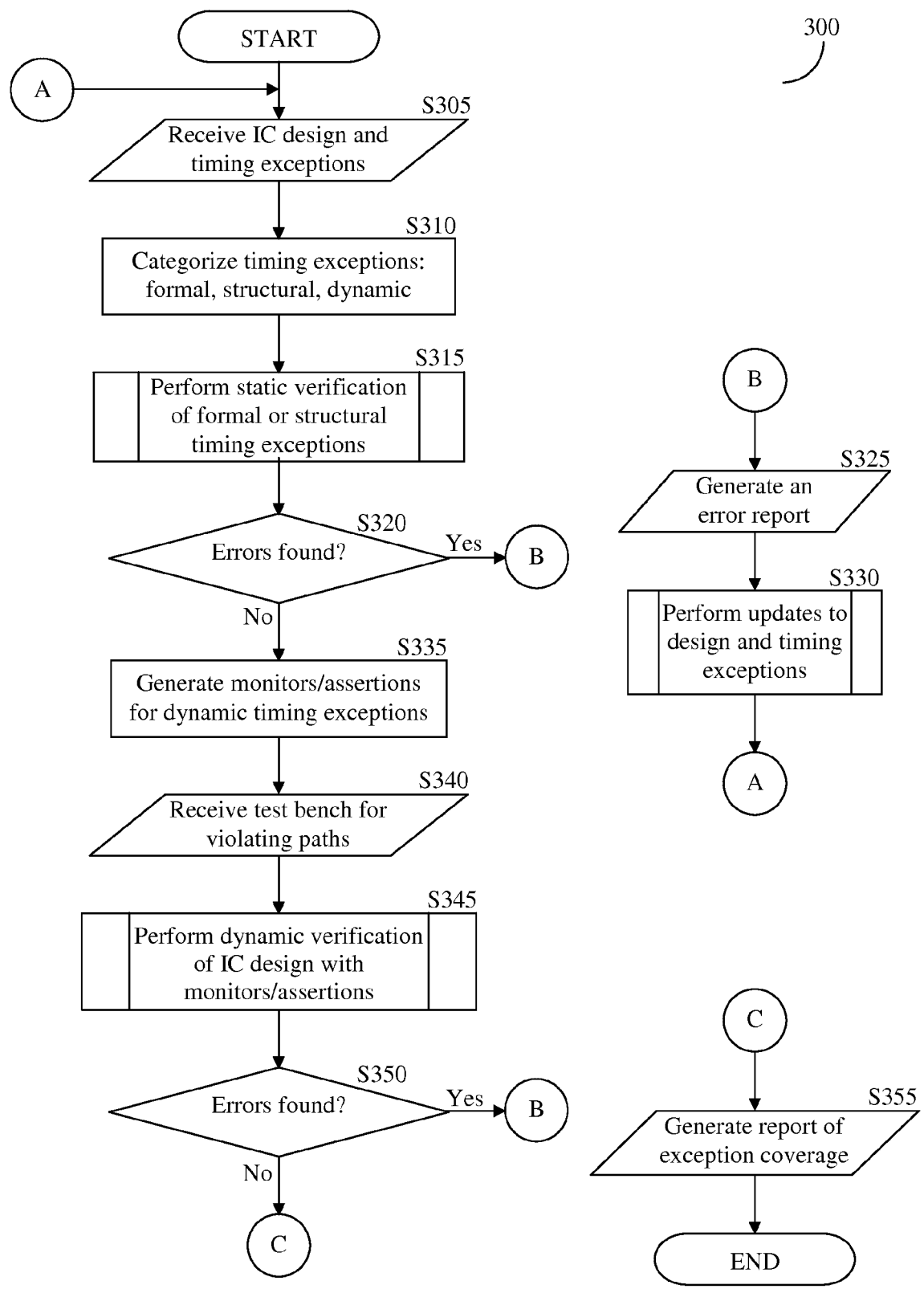

Reference is now made to FIG. 3 that is an exemplary and non-limiting flowchart 300 depicting the hybrid timing exception verification flow. In S305 respective files of an IC design and its corresponding constraint files, such as SDC files, containing at least the timing exceptions for the IC design, are received or otherwise fetched. In S310 the timing exceptions are categorized to static formal timing exceptions, static structural timing exceptions and dynamic timing exceptions. In S315 static verification of the formal and/or structural timing exceptions takes place. In S320 it is checked whether errors have been found and if so execution continues with S325; otherwise, execution continues with S335. In S325 an error report is generated, the report being used in S330 for handling automatically, semi-automatically or manually, as described hereinabove, the necessary updates of the IC design and/or timing exceptions, after which execution continues with S305. In S335 monitors and/or assertions (see FIG. 4 for an exemplary monitor creation) are generated for those paths of the timing exceptions categorized as dynamic. In S340 a test bench is received or otherwise fetched, which is to be used for the purpose of the simulations of the IC design together with the monitors and/or assertions thereof. In S345 the simulation takes place to verify one or more suspect timing exceptions determined to be of the dynamic category. In S350 it is checked whether errors were found and if so execution continues with S325; otherwise, execution continues with S355 where an optional report is provided detailing the exception coverage. In another exemplary implementation a static coverage report is provided in each iteration of the static verification, and a dynamic coverage report is provided in each iteration of the dynamic verification. Other reporting schemes maybe possible without departing from the spirit of the invention. Such implementations, as well as other appropriate reporting are meant to be part of the invention and do not depart from the spirit of the invention. With respect to S325 it should be noted that this step can also handle errors related to the dynamic verification step and enable the process for correction of such errors and then repeating the verification process. In an exemplary implementation only the dynamic verification process takes place on an iterative basis once the static verification was found to be errorless.

Figure 4:
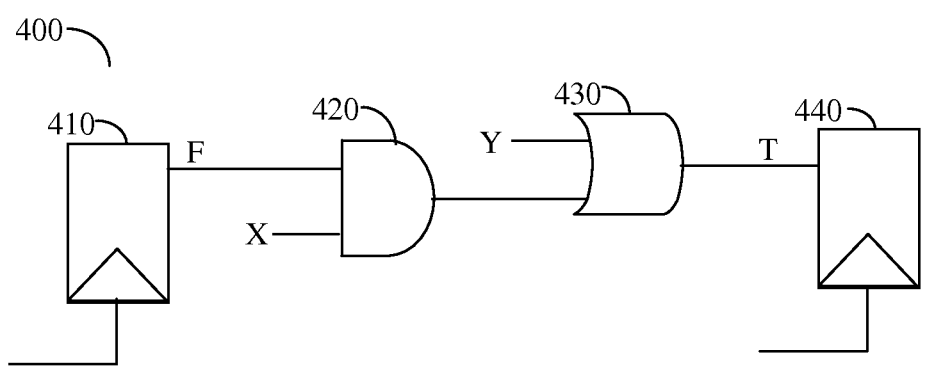

FIG. 4 shows an exemplary and non-limiting circuit 400 having an identified false path for generation of a monitor. The circuit 400 includes a flip-flop (FF) 410 the output F of which is connected to one input of an AND gate 420, the other input of AND gate 420 may come from any other gate or input X. The output of AND gate 420 is one input to an OR gate 430 the other input of which is driven by any other gate or input Y. The output of OR gate 420 is connected to a toggle input of a T-FF 440. According to an exemplary implementation, for example in S340, conditions are extracted under which transitions propagate through the circuit 400. Monitors are then generated that will watch the signal T and will trigger a check and if a violation is detected a report will be issued. In the exemplary case of circuit 400 the designer may set the following constraint:

(1) set_false_path-from F-to T

As a response a monitor will be generated according to an exemplary implementation:

(2) Transition-on-F AND X==1 AND Y==0 AND Transition-on-T

It would be therefore possible to now get an indication if the error condition is met during simulation. In one embodiment of the invention the model used above can be replaced by any other model that can accurately model a timing exception such as the one discussed in U.S. Pat. No. 7,650,581 by Rahim et al. Furthermore a timing sensitive model can also be used which means that the system can detect those false paths that are subject to glitches.

It should be appreciated by those of ordinary skill in the art that by pushing the exception handling of those structures not readily yielding to static verification to a dynamic verification stage, and then using dynamic verification to verify such exceptions, that a significant reduction in the overhead of verifying timing exceptions is achieved. This results in a more reliable design process and an ability to have an IC more likely to perform after first tape-out, as the burden of waiving error using prior art solutions was tedious and error prone.

The principles described above may be implemented as hardware, firmware, software tangibly embodied in computer readable and non-transient media, or any combination thereof, including but not limited to a CAD system and software products thereof, the software designed to execute on an appropriate apparatus for execution of the plurality of instructions that are contained in the software. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit.

All examples and conditional language recited herein are intended for pedagogical purposes to aid the reader in understanding the principles described above and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

The invention claimed is:

1. A computerized method for verification of timing exceptions of an integrated circuit (IC) design, the method comprising:

performing by a computing device at least a dynamic verification using a test-bench of the IC design to verify correctness of at least a dynamic timing exception, filtered out from a static verification of at least a static timing exception of the IC design, that is contained in at least a constraints file of the IC design to identify any dynamic timing exception failures; and correcting any timing exception or design bug respective of an identified dynamic timing exception failure caused by simulation of an assertion for at least one timing exception and updating the IC design and the respective design constraint files respective of the correction.

2. The computerized method of claim 1, wherein performing by a computing device at least a dynamic verification comprises:

generating by a computing device monitors and assertions for timing exceptions categorized as dynamic timing exceptions.

3. The computerized method of claim 2, further comprising:

receiving the test bench that contains at least a test vector for the IC design.

4. The computerized method of claim 3, further comprising:

performing by a computing device a simulation of the IC design using the test bench instrumented with the monitors and assertions.

5. The computerized method of claim 4, further comprising:
collecting by a computing device errors from the performance of the simulation responsive of the monitors and assertions indicating a failure of at least one of the dynamic timing exceptions.

6. The computerized method of claim 5, further comprising:
repeating at least once more the method of claim 1 beginning with the receiving the IC's design and the respective design constraint file.

7. The computerized method of claim 1, further comprising:
generating a coverage report respective of coverage of the dynamic verification.

8. A non-transitory computer readable storage medium storing instructions for enabling a computer to perform the computerized method of claim 1.

9. A system for verification of timing exceptions of an IC design that performs on the computing device at least the dynamic verification according to the computerized method of claim 1.

10. The system of claim 9, wherein the system is a computer aided design (CAD) system.

11. The computerized method of claim 1, further comprising:
performing by a computing device a static verification of timing exceptions categorized as belonging to at least one of static structural timing exceptions and static formal timing exceptions and generating a report containing errors respective of at least one of static structural timing exception failures and static formal timing exception failures.

12. The computerized method of claim 11, further comprising:
correcting the timing exceptions responsive to the report respective of at least one static structural timing exception failures and static formal timing exception failures and updating the IC design or the respective design constraints file respective of the corrections to the timing exceptions.

* * * * *